United States Patent
Song (10) Patent No.: US 7,660,173 B2
(45) Date of Patent: Feb. 9, 2010

(54) SEMICONDUCTOR MEMORY DEVICE AND OPERATING METHOD WITH HIDDEN WRITE CONTROL

(75) Inventor: Yoon-Gyu Song, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 117 days.

(21) Appl. No.: 11/730,223

(22) Filed: Mar. 30, 2007

(65) Prior Publication Data
US 2008/0008022 A1 Jan. 10, 2008

(30) Foreign Application Priority Data
Jul. 10, 2006 (KR) ...................... 10-2006-0064624

(51) Int. Cl.
G11C 29/00 (2006.01)
G11C 7/00 (2006.01)
(52) U.S. Cl. .................. 365/201; 365/222; 365/189.16
(58) Field of Classification Search .................. 365/222, 365/201
See application file for complete search history.

(56) References Cited

U.S. PATENT DOCUMENTS

| | | | | |
|---|---|---|---|---|
| 5,475,646 A * | 12/1995 | Ogihara | .................. | 365/230.03 |
| 5,793,694 A * | 8/1998 | Akiba et al. | ........... | 365/230.03 |
| 5,877,978 A * | 3/1999 | Morishita et al. | ........... | 365/149 |
| 6,134,171 A * | 10/2000 | Yamagata et al. | ........... | 365/229 |
| 6,262,939 B1 * | 7/2001 | Matsui | .................. | 365/233.12 |
| 6,392,952 B1 * | 5/2002 | Chen et al. | ............. | 365/230.03 |
| 6,545,925 B2 * | 4/2003 | Lee | ............................. | 365/222 |
| 2002/0194559 A1 | 12/2002 | Lukas et al. | | |
| 2003/0204798 A1 * | 10/2003 | Adams et al. | ............... | 714/723 |

FOREIGN PATENT DOCUMENTS

JP 06-076569 3/1994
JP 2002-124096 4/2002

* cited by examiner

*Primary Examiner*—VanThu Nguyen
*Assistant Examiner*—R Lance Reidlinger
(74) *Attorney, Agent, or Firm*—Volentine & Whitt, PLLC (57) ABSTRACT

A semiconductor memory device and its operating method are disclosed. The semiconductor memory device includes; a memory cell array including a plurality of memory cells selected in relation to a plurality of word lines and a plurality of bit lines, an address decoder selecting at least one word line in response to a refresh address and selecting all of the plurality of bit lines in response to a hidden write signal when a CBR refresh operation is requested during a test mode, a hidden write control circuit generating the hidden write signal when the CBR refresh operation is requested during the test mode, a refresh address generating circuit generating the refresh address when the CBR refresh operation is requested during the test mode, and a data input circuit applying data to all of the plurality of bit lines when the CBR refresh operation is requested during the test mode.

21 Claims, 6 Drawing Sheets

SEMICONDUCTOR MEMORY DEVICE AND OPERATING METHOD WITH HIDDEN WRITE CONTROL

BACKGROUND OF THE INVENTION

1. Field of the Invention

The present invention relates to a semiconductor memory device. More particularly, the invention relates to an operating method for a semiconductor memory device having reduced test initialization time.

This application claims the benefit of Korean Patent Application No. 10-2006-0064624, filed Jul. 10, 2006, the subject matter of which is hereby incorporated by reference in its entirety.

2. Description of the Related Art

Contemporary semiconductor memory devices are generally characterized by increased integration density and decreased power consumption. In order to achieve these results, the constituent transistors must have longer effective channel lengths, but reduced overall physical size. These properties have been obtained in the recess channel array transistor (RCAT) and a sphere shaped recess channel array transistor (SRCAT). As a result, these types of transistors are now commonly used memory cell transistors in semiconductor memory devices.

However, when a semiconductor memory device is realized using these types of cell transistors, the device routinely fails an initial power test. Indeed, this initial testing failure at the chip level is all but expected given the unique operating properties of these device types. Fortunately, subsequently applied testing, particularly module level testing, yields useful test results. Thus, the initial test failure may be ignored or bypassed.

In conventionally applied test methods, this initial test failure phenomenon may be effectively "skipped" in several fashions. For example, a dummy CAS before RAS (CBR) refresh operation and a dummy write operation may be used to exercise the memory cell transistors one or more times. Thereafter, an actual test operation may be performed. In effect, the preliminary exercise of the cell transistors prepares them for subsequent testing.

Figure 1:
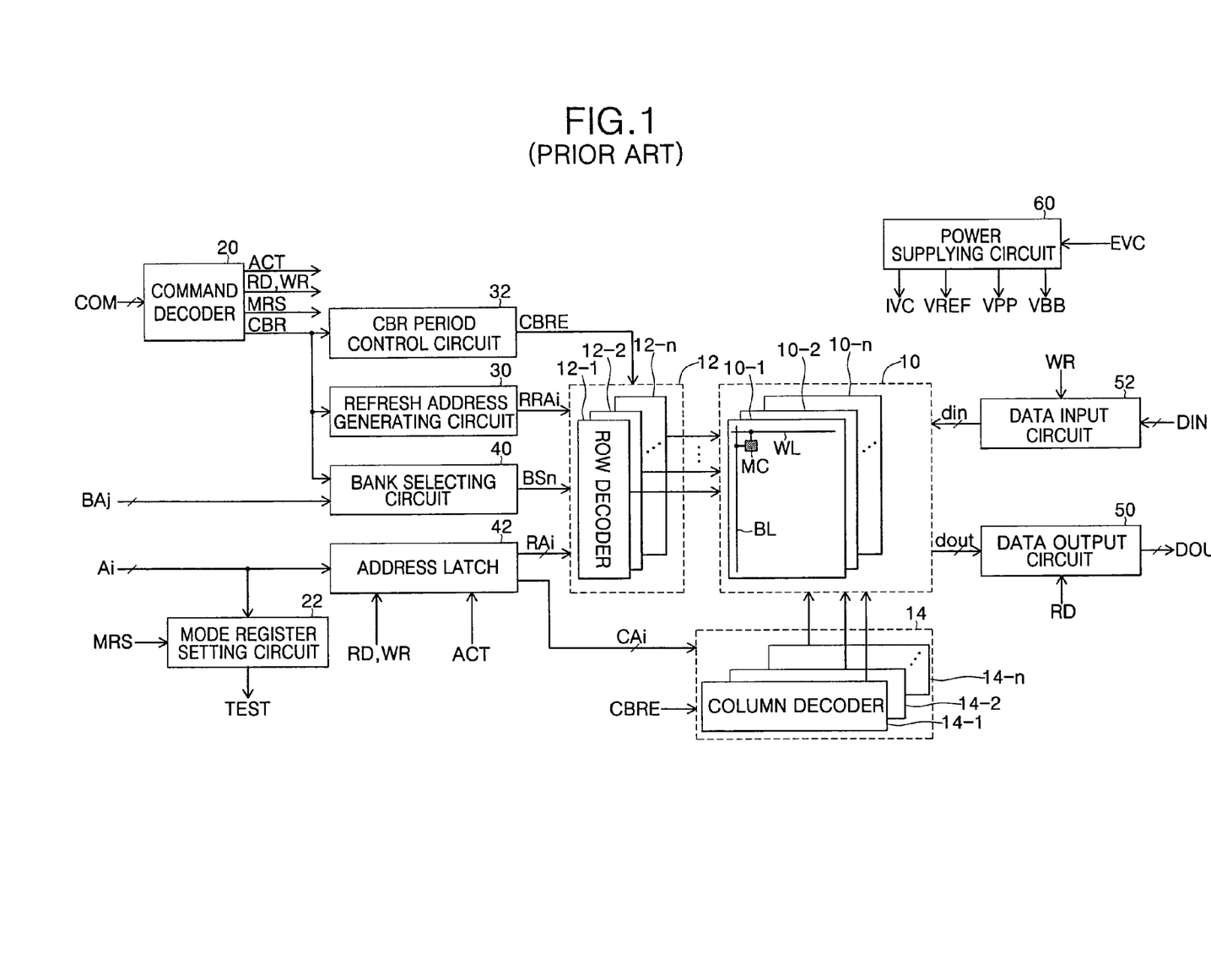
FIG. 1 is a block diagram illustrating a configuration of a conventional semiconductor memory device.

FIG. 1 is a block diagram illustrating an exemplary configuration for a conventional semiconductor memory device.

Referring to FIG. 1, the semiconductor memory device comprises a memory cell array 10, a row decoder circuit 12, a column decoder circuit 14, a command decoder 20, a mode register setting circuit 22, a refresh address generating circuit 30, a CBR period control circuit 32, a bank selecting circuit 40, an address latch 42, a data output circuit 50, a data input circuit 52, and a power supply circuit 60.

The memory cell array 10 comprises a plurality of memory cell array banks 10-1 to 10-n, where "n" is the natural number. Each bank comprises a plurality of memory cells MC connected between a word line WL and a bit line BL. Each bank writes/reads data to/from a memory cell MC selected in response to one signal transmitted via word line WL and another signal transmitted via the bit line BL.

The row decoder circuit 12 comprises a plurality of row decoders 12-1 to 12-n which respectively correspond to a plurality of banks 10-1 to 10-n. The row decoder circuit 12 selects one bank and at least one word line for a memory operation in accordance with a bank selecting signal BS and a row address RAi. Alternately, the row decoder circuit 12 selects all banks simultaneously and at least one word line in each bank in accordance with bank selecting signal BC and a refresh address RRAi. The row decoder circuit 12 also terminates the operation indicated by the bank selecting signal BC and the refresh address RRAi in response to a CBR end signal CBRE.

The column decoder circuit 14 comprises a plurality of column decoders 14-1 to 14-n which respectively correspond to a plurality of banks 10-1 to 10-n. The column decoder circuit 14 selects one bank and at least bit line BL to perform a read or write operation in accordance with a column address CAi. The column decoder circuit 14 also terminates the operation indicated by the column address CAi in response to the CBR end signal CBRE.

The command decoder 20 receives and combines externally applied command signals COM to generate, for example, an active signal ACT, a write signal WR, a read signal RD, a CBR signal CBR, and a mode register signal MRS. Collectively, these control signals determine an operating state for the semiconductor memory device. In particular, when a signal /CAS is applied before a signal /RAS, the command decoder 20 generates the CBR signal CBR for requesting a CBR refresh operation and supplies it to the refresh address generating circuit 30 and the CBR period control circuit 32.

The mode register setting circuit 22 receives and analyzes addresses Ai to determine whether a test mode is indicated when the mode register signal MRS is applied from the command decoder 20. The mode register setting circuit 22 generates a test signal TEST during a test mode.

The refresh address generating circuit 30 performs an up or down counting operation whenever the CBR refresh operation is requested, (i.e., whenever the CBR signal is applied). The refresh address generating circuit 30 generates the refresh addresses RRAi for sequentially selecting the word lines according to the count result and supplies it to the row decoder 12. That is, whenever the CBR refresh operation is requested, the refresh addresses RRAi for sequentially selecting the word lines are generated.

The CBR period control circuit 32 calculates lapsed time when the CBR signal is applied from the command decoder 20, and generates the CBR end signal CBRE following a particular time lapse of tREF. The CBR end signal CBRE is supplied to the row decoder 12 and the column decoder 14 so that the next CBR refresh operation can be performed. Here, the lapsed time tREF is defined as the time until the next CBR refresh operation is performed after the CBR refresh operation is performed. As well known in the art, this time period defines the CBR refresh operation time.

The bank selecting circuit 40 decodes a plurality of externally applied bank addresses BAj in order to generate a bank selecting signal BS selecting one of a plurality of banks 10-1 to 10-n. The bank selecting circuit 40 also generates the bank selecting signal BS for simultaneously selecting all of a plurality of banks 10-1 to 10-n when the CBR refresh operation is requested and so the CBR signal CBR is applied.

The address latch 42 determines a method for analyzing a plurality of externally applied addresses Ai in response to the active signal ACT, the write signal WR, and the read signal RD. The address latch 42 then latches a plurality of addresses Ai to be transmitted to the row decoder circuit 12 as the row address RAi during an activation command in which the active signal ACT is generated, and also latches a plurality of addresses Ai to be transmitted to the column decoder circuit 14 as the column address CAi during a read/write command in which the read/write signal WR/RD is enabled.

The data input circuit 52 receives data DIN from a data I/O pin (not shown) and supplies data din to the memory array 10 when a write operation is requested (i.e., when the write signal WR is applied).

The data output circuit 50 receives data dout output from the memory array 10 and supplies data DOUT to the data I/O pin (not shown) when the read operation is requested (i.e., when the read signal RD is applied).

The power supply circuit 60 receives an externally applied voltage EVC and generates an internal voltage IVC, a reference voltage VREF, a boosting voltage VPP, and a back bias voltage VBB as well as other operating and control voltages with the illustrated semiconductor memory device.

Figure 2:
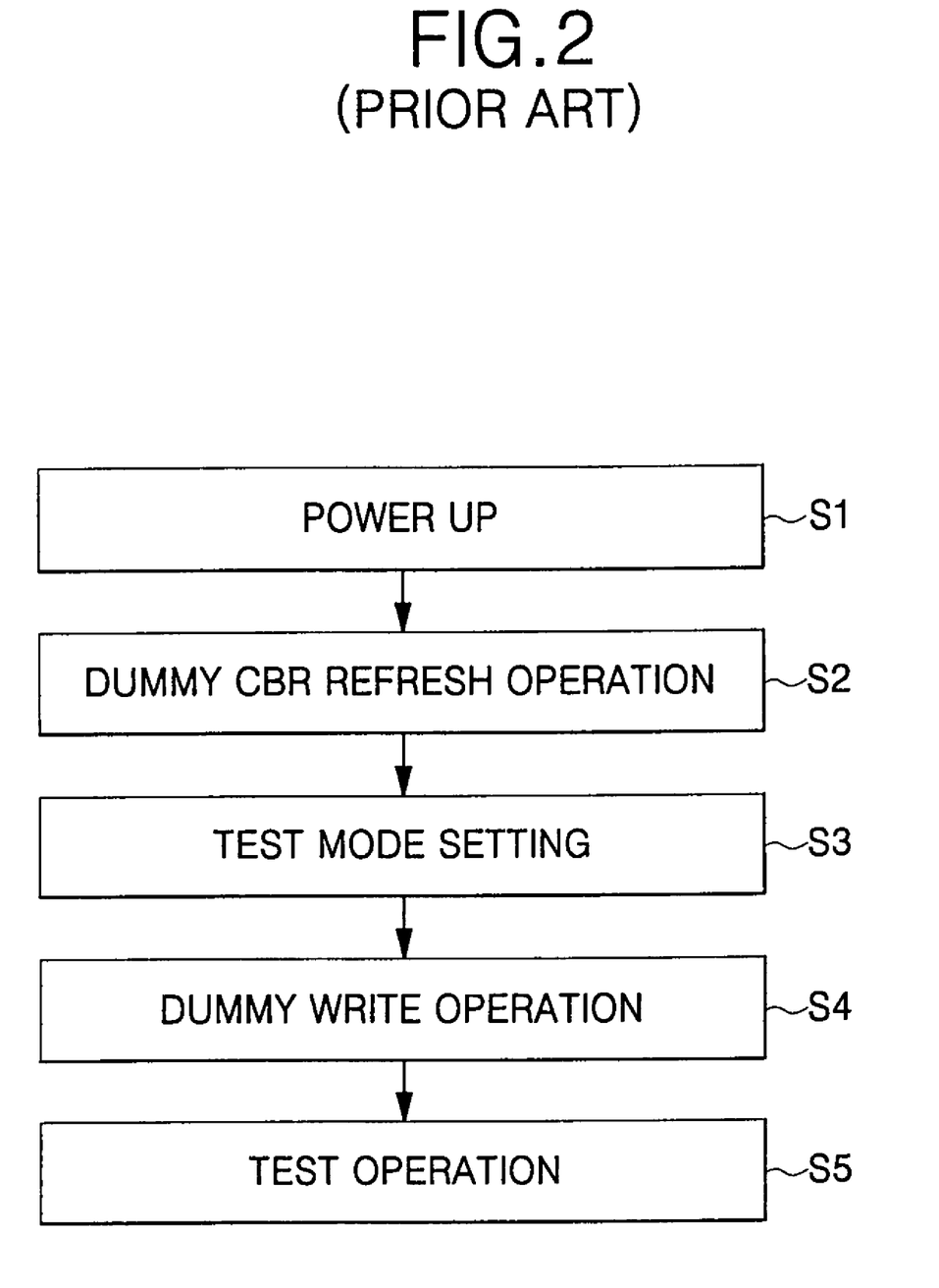
FIG. 2 is a flowchart illustrating a test initialization method of the conventional semiconductor memory device.

A test initialization method for a conventional semiconductor memory device, such as the one illustrated in FIG. 1, will now be explained with reference to the general flowchart of FIG. 2.

Test initialization begins with provision of a command COM and the addresses BAj and Ai to the semiconductor memory device. In response, the semiconductor memory device sequentially performs a power-up operation (S1), the dummy CBR refresh operation, the test mode setting operation, and the dummy write operation.

Thus, the semiconductor memory device is powered up (S1) and then performs the dummy CBR refresh operation at the tester's request. That is, the command COM for requesting the CBR refresh operation is repeatedly received within a predetermined time period, a plurality of row decoders 12-1 to 12-n sequentially select the word lines under control of the bank selecting circuit 40 and the refresh address generating circuit 30, and the refresh operation for the selected word line is performed (S2).

Subsequently, the semiconductor memory device sets the test mode through the mode register setting circuit 22 at the tester's request (S3) and then performs the dummy write operation. That is, a plurality of row decoders 12-1 to 12-n select one bank and one bit line under control of the bank selecting circuit 40 and the address latch 42, and a plurality of column decoders 14-1 to 14-n select one bit line to write data to one memory cell under control the address latch 42. The write operation is repeatedly performed until all memory cells in all banks write data (S4).

When the semiconductor memory device finishes the dummy CBR refresh operation and the dummy write operation, it confirms that the test initialization is complete and begins actual test operations under the control of the tester (S5). Any number of conventional test operations may now be performed.

As described above, the conventional semiconductor memory device separately performs the dummy CBR refresh operation and the dummy write operation during the test initialization to drive the cell transistor at least one time before beginning the actual test operation. While this approach accounts for the expected initial test failure, its also increases the time required to test time the semiconductor device, since the dummy CBR refresh operation and the dummy write operation must be performed for every test initialization. This is particularly true for the dummy write operation where only a single memory cell connected between one word line and one bit line may be selected and driven.

SUMMARY OF THE INVENTION

Embodiments of the invention provide a semiconductor memory device and operating method in which the test initialization time is significantly reduced by performing the hidden write operation using the CBR refresh command.

In one embodiment, the invention provides a semiconductor memory device, comprising; a memory cell array including a plurality of memory cells selected in relation to a plurality of word lines and a plurality of bit lines, an address decoder selecting at least one word line in response to a refresh address and selecting all of the plurality of bit lines in response to a hidden write signal when a CBR refresh operation is requested during a test mode, a hidden write control circuit generating the hidden write signal when the CBR refresh operation is requested during the test mode, a refresh address generating circuit generating the refresh address when the CBR refresh operation is requested during the test mode, and a data input circuit applying data to all of the plurality of bit lines when the CBR refresh operation is requested during the test mode.

In another embodiment, the invention provides a semiconductor memory device, comprising; a plurality of banks each including a plurality of memory cells selected in accordance with a plurality of word lines and a plurality of bit lines, an address decoder selecting all of the plurality of banks in accordance with a bank selecting signal, selecting at least one word line in response to a refresh address, and selecting all of the plurality of bit lines in response to a hidden write signal when a CBR refresh operation is requested during a test mode, a hidden write control circuit generating the hidden write signal when the CBR refresh operation is requested during the test mode, a refresh address generating circuit generating the refresh address when the CBR refresh operation is requested during the test mode, and a data input circuit applying data to all of the plurality of bit lines when the CBR refresh operation is requested during the test mode.

In another embodiment, the invention provides an operating method for a semiconductor memory device including a memory cell array having a plurality of memory cells selected in relation to a plurality of word lines and a plurality of bit lines, the method comprising; after generating a CBR signal, generating a hidden write signal when a CBR refresh operation is requested during a test mode, initiating a refresh operation in response to the CBR signal and selecting at least one word line from the plurality of word lines, and selecting all of the plurality of bit lines in response to the hidden write signal such that that all memory cells connected to the at least one bit line write data transmitted from the plurality of bit lines.

DESCRIPTION OF EMBODIMENTS

Embodiments of the invention will now be described with reference to the accompanying drawings. The invention may, however, be embodied in many different forms and should not be construed as limited to only the embodiments set forth herein. Rather, these embodiments are provided so as teaching examples. Throughout the written description and drawings, like reference numbers indicate like or similar elements.

Figure 3:
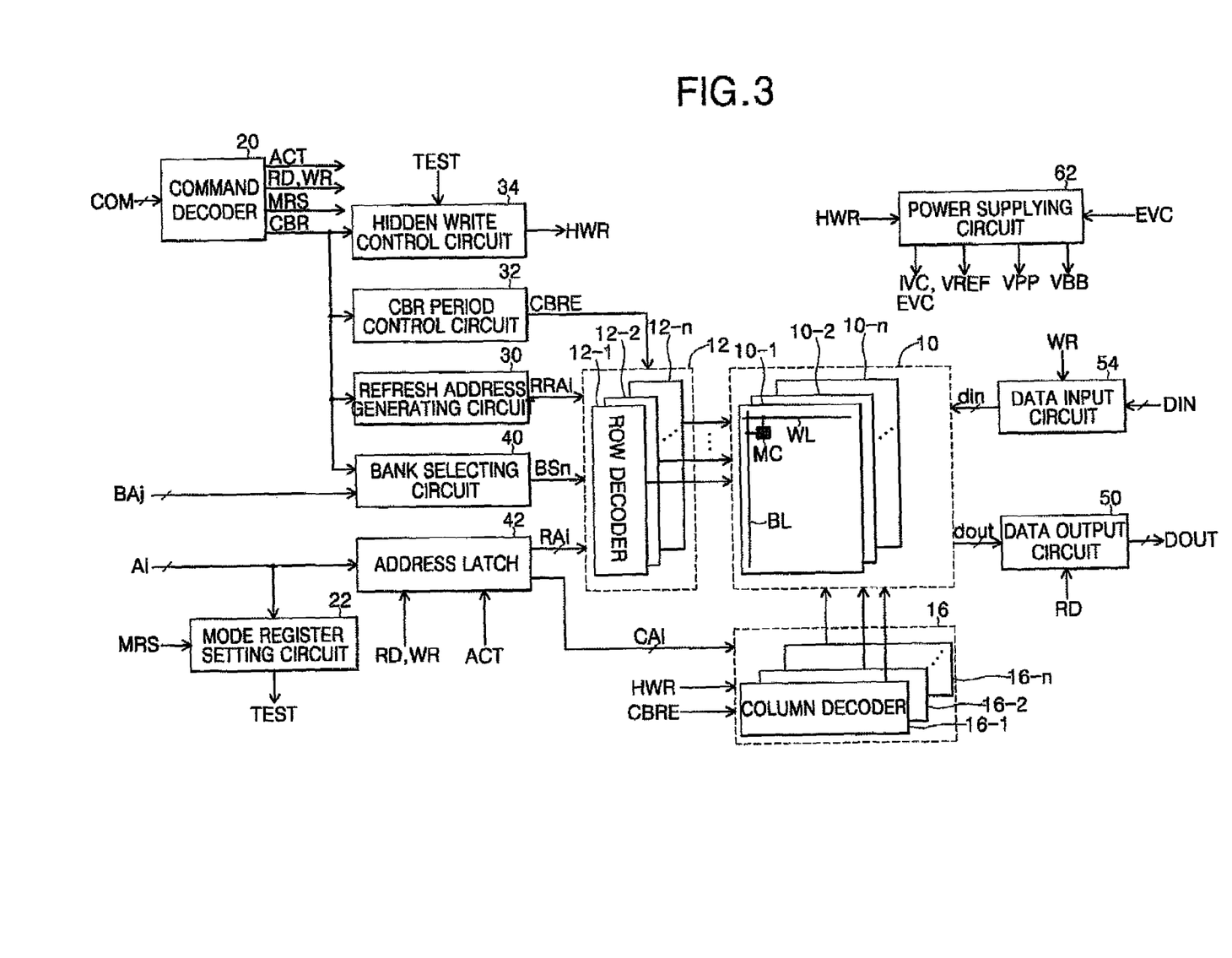
FIG. 3 is a block diagram illustrating a semiconductor memory device according to an exemplary embodiment of the present invention.

FIG. 3 is a block diagram of a semiconductor memory device according to an embodiment of the invention.

Referring to FIG. 3, the semiconductor memory device comprises a memory cell array 10, a row decoder circuit 12, a column decoder circuit 16, a command decoder 20, a mode register setting circuit 22, a refresh address generating circuit 30, a CBR period control circuit 32, a hidden write control circuit 34, a bank selecting circuit 40, an address latch 42, a data input circuit 54, a data output circuit 50, and a power supply circuit 62.

The memory cell array 10 comprises a plurality of memory cell array banks 10-1 to 10-n, where "n" is the natural number. Each bank comprises a plurality of memory cells MC connected between a word line WL and a bit line BL, and writes/reads data to/from a memory cell MC selected in response to a signal transmitted from the word line WL and a signal transmitted from the bit line BL.

The row decoder circuit 12 comprises a plurality of row decoders 12-1 to 12-n which respectively correspond to a plurality of banks 10-1 to 10-n. The row decoder circuit 12 selects one bank and at least one word line for a memory operation in response to a bank selecting signal BC and a row address RAi. Alternately, the row decoder circuit 12 selects all banks simultaneously before selecting at least one word line in each bank in response to a bank selecting signal BC and a refresh address RRAi. The row decoder circuit 12 also terminates the operation indicated by the bank selecting signal BC and the refresh address RRAi in response to a CBR end signal CBRE.

The column decoder circuit 16 comprises a plurality of column decoders 16-1 to 16-n which respectively correspond to a plurality of banks 10-1 to 10-n. The column decoder circuit 16 selects one bank and at least bit line BL for a memory operation in response to a column address CAi during a normal operation. However, during a test mode, the column decoder circuit 16 selects all banks simultaneously before simultaneously selecting all of a plurality of bit lines BL in each bank in response to a hidden write signal HWR. The column decoder circuit 16 also terminates the operation indicated by the bank selecting signal BC and the refresh address RRAi in response to the CBR end signal CBRE.

The command decoder 20 receives and combines externally applied command signals COM to generate an active signal ACT, a write signal WR, a read signal RD, a CBR signal CBR, and a mode register signal MRS, etc. In the illustrated example, these control signals cooperate to determine an operating state for the semiconductor memory device. In particular, when a signal /CAS is applied before a signal /RAS, the command decoder 20 generates the CBR signal requesting a CBR refresh operation and supplies it to the refresh address generating circuit 30, the CBR period control circuit 32 and a hidden write control circuit 34.

The mode register setting circuit 22 receives and analyzes addresses Ai to determine whether to enter a test mode when the mode register signal MRS is applied from the command decoder 20, and generates a test signal TEST during a test mode.

The refresh address generating circuit 30 performs an up or down counting operation whenever the CBR signal CBR is applied, and generates the refresh addresses RRAi for sequentially selecting the word lines according to the counting result and supplies it to the row decoder 12.

The CBR period control circuit 32 calculates a time lapsed when the CBR signal CBR is applied from the command decoder 20, and generates the CBR end signal CBRE when a time of tREF lapses and supplies it to the row decoder 12 and the column decoder 16 so that the CBR refresh operation for the new word line can be performed. Here, the time period tREF is determined by the occurrence of the next CBR refresh operation after the CBR refresh operation is performed, (i.e., time period tREF defines the CBR refresh operation time).

When both the test signal TEST and the CBR signal CBR are enabled, the hidden write control circuit 34 confirms that a write operation for the test initialization (hereinafter, hidden write operation) using the CBR refresh command is requested, and generates a hidden write signal HWR and supplies it to the column decoder 16 and the power supply circuit 62. The hidden write signal HWR is generated following a time period tRCD following the point in time at which the CBR signal is enabled. The time period tRCD is defined by the occurrence of a read or write command requested following the activation command, (i.e., time period tRCD defines a waiting time until the bit line can be stably selected after the word line is selected).

The bank selecting circuit 40 decodes a plurality of externally applied bank addresses BAj to generate a bank selecting signal BS for selecting one of a plurality of banks 10-1 to 10-n. The bank selecting circuit 40 also generates the bank selecting signal BS for simultaneously selecting all of a plurality of banks 10-1 to 10-n when the CBR signal CBR is applied.

The address latch 42 determines a method for analyzing a plurality of externally applied addresses Ai in response to the active signal ACT, the write signal WR, and the read signal RD. The address latch 42 latches a plurality of addresses Ai to be transmitted to the row decoder circuit 12 as the row address RAi during an activation command in which the active signal ACT is generated, and latches a plurality of addresses Ai to be transmitted to the column decoder circuit 14 as the column address CAi during a read/write command in which the read/write signal WR/RD is enabled.

The data input circuit 54 receives data DIN from a data I/O pin (not shown) and supplies data din to the memory array 10 when the write signal WR is applied.

The data output buffer 52 receives data dout outputted from the memory array 10 and supplies data DOUT to the data I/O pin (not shown) when the read signal RD is applied.

The power supply circuit 62 receives an externally applied voltage EVC and generates an internal voltage IVC, a reference voltage VREF, a boosting voltage VPP, and a back bias voltage VBB. The power supply circuit 62 applies the external voltage EVC instead of the internal voltage IVC to the data line (not shown) for transmitting data dout when the hidden write signal HWR is applied from the hidden write control circuit 34.

Figure 4:
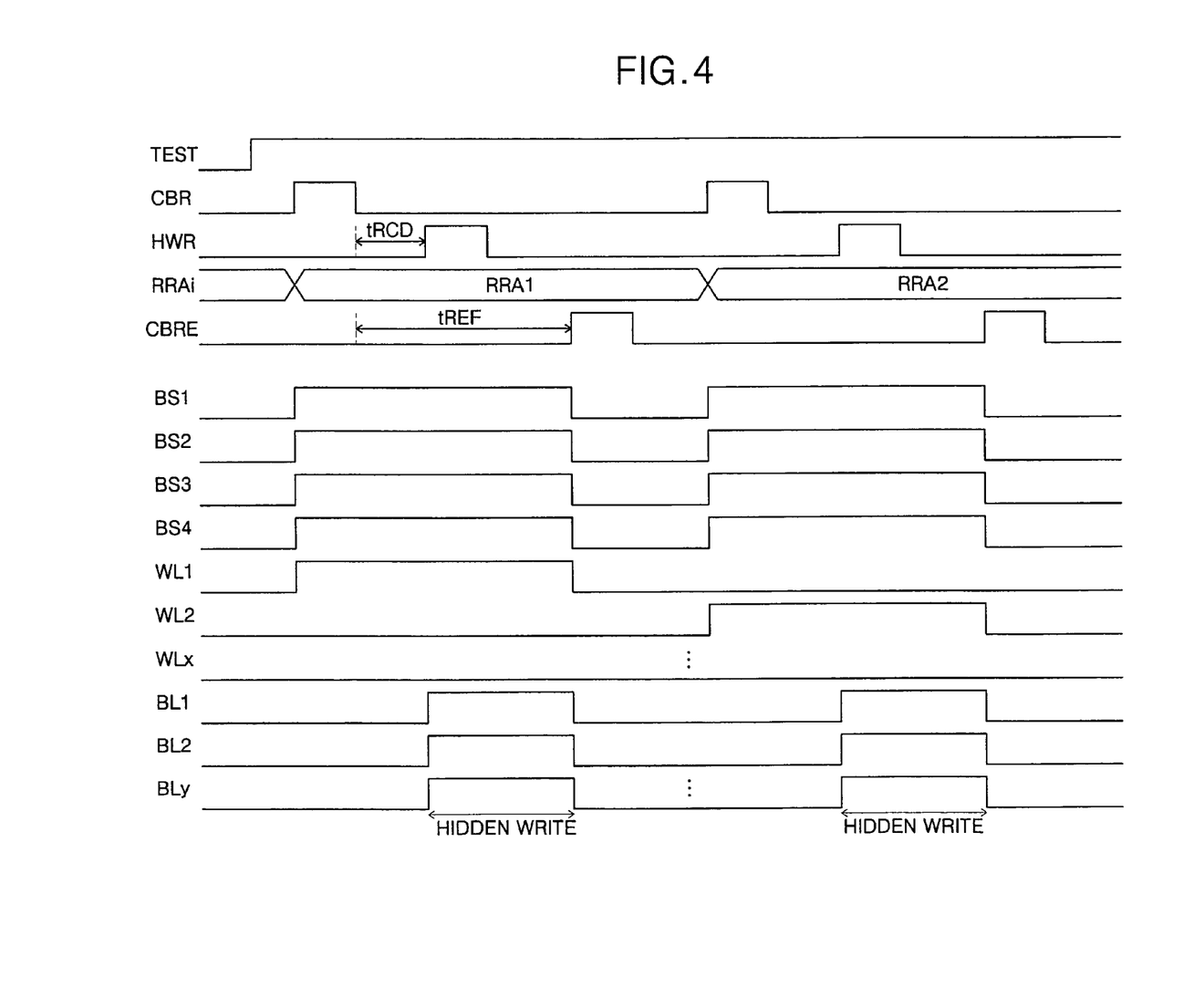
FIG. 4 is a timing diagram illustrating a hidden write operation using a CBR refresh command according the exemplary embodiment of the present invention.

A hidden write operation method using the CBR refresh command according to an embodiment of the present invention will be explained with reference to FIG. 4.

Here, for better understanding, it is assumed that the semiconductor memory device has four banks, and a command for commanding the CBR refresh operation is repeatedly supplied until all of a plurality of word lines are selected during a predetermined time period after a command COM for commanding the test mode setup and an address Ai are supplied from the tester in order to perform the hidden write operation for the test initialization.

The mode register setting circuit 22 sets the operating mode for the semiconductor mode to the test mode in order to generate the test signal TEST, and the command decoder 20 repeatedly generates the CBR signal for commanding the CBR refresh operation.

When a first CBR signal is generated, the bank selecting circuit 40 enables all of bank selecting signals BS1 to BSn, and the refresh address generating circuit 30 generates the refresh address RRAi for selecting the word line (e.g., WL1), so that the four row decoders 12-1 to 12-4 select one word line WL1 of the corresponding banks 10-1 to 10-4, respectively.

At the same time, the power supply circuit 62 applies the external voltage EVC instead of the internal voltage IVC to the data line depending on the CBR signal so that the bit line has a data value of "1".

In this state, when the time tRCD lapses and the hidden write control circuit 34 generates the hidden write signal HWR in response to the test signal TEST and the CBR signal CBR, each of the four column decoders 16-1 to 16-4 selects all of bit lines BL1 to BLy of the corresponding bank.

The memory cells connected to the word line WL1 by the row decoders 12-1 to 12-4 write a logic value of "1" applied to the bit line.

When the time tRFC lapses after the CBR signal is generated and the CBR period control circuit 32 generates the CBR end signal CBRE, the four row decoders 12-1 to 12-4 and column decoders 16-1 to 16-4 terminates the current selecting operation for the new hidden write operation and performs an automatic pre-charge operation.

When a second CBR signal CBR is generated, the refresh address generating circuit 30 generates the refresh address RRAi for selecting the next word line (e.g., WL2). The semiconductor memory device performs the hidden write operation for the next word line WL2 using the above described method.

The above described method is repeatedly performed until the refresh address generating circuit 30 selects all of the word lines so that the all memory cells in the semiconductor memory device can perform the hidden write operation.

As described above, the semiconductor memory device according to an embodiment of the invention integrates the dummy CBR refresh operation and the dummy write operation of the conventional semiconductor memory device into one operation, thereby reducing the test initializing time. The conventional semiconductor memory device operates such that only one memory can write data through the single dummy write operation may be performed, whereas the semiconductor memory device of the present invention operates such that all memory cells connected to a common word line can write data through the single hidden write operation, thereby significantly reducing the test time.

Figure 5:
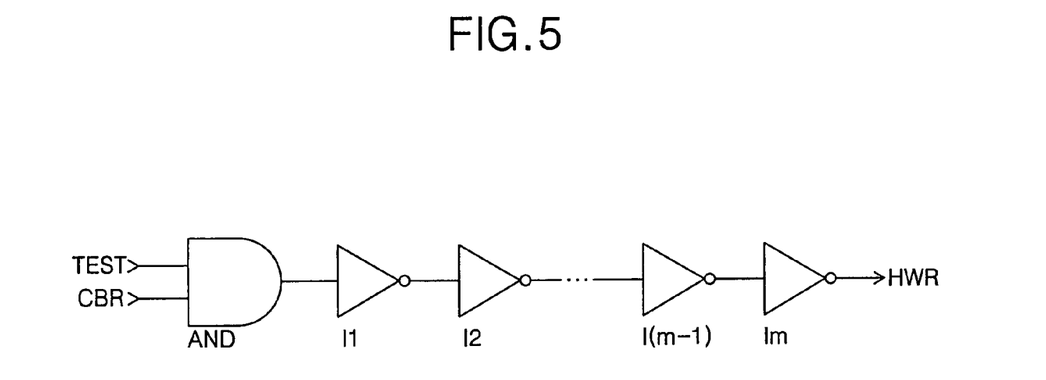
FIG. 5 is a circuit diagram illustrating a hidden write control circuit according to the exemplary embodiment of the present invention.

FIG. 5 is a circuit diagram illustrating one example of a hidden write control circuit according to an embodiment of the invention.

Referring to FIG. 5, the hidden write control circuit 34 comprises an AND gate for logically multiplying the test signal TEST and the CBR signal to generate the hidden write signal HWR, and even-number m inverters I1 to Im which delay the hidden write signal HWR by the time tRCD before outputting it. Here, m is the natural, even number.

During a normal operation in which the test signal TEST and the CBR signal CBR are disabled, the AND gate generates the hidden write signal HWR at a logically low level, and the m inverters I1 to Im delay it by the time tRCD before outputting it. In this manner, the hidden write control circuit 34 may generate and output the disabled hidden write signal HWR.

When the CBR refresh operation for the test initialization, (i.e., the hidden write operation using the CBR refresh command is requested such that the test signal TEST and the CBR signal CBR are enabled), the AND gate generates the hidden write signal HWR at a logically high level, and the m inverters I1 to Im delay it by the time tRCD before outputting it.

That is, the hidden write control circuit 34 outputs the hidden write signal HWR when the time tRCD lapses after the hidden write operation using the CBR refresh command is requested so that a plurality of column decoders 16-1 to 16-n can stably select all bit lines.

Figure 6:
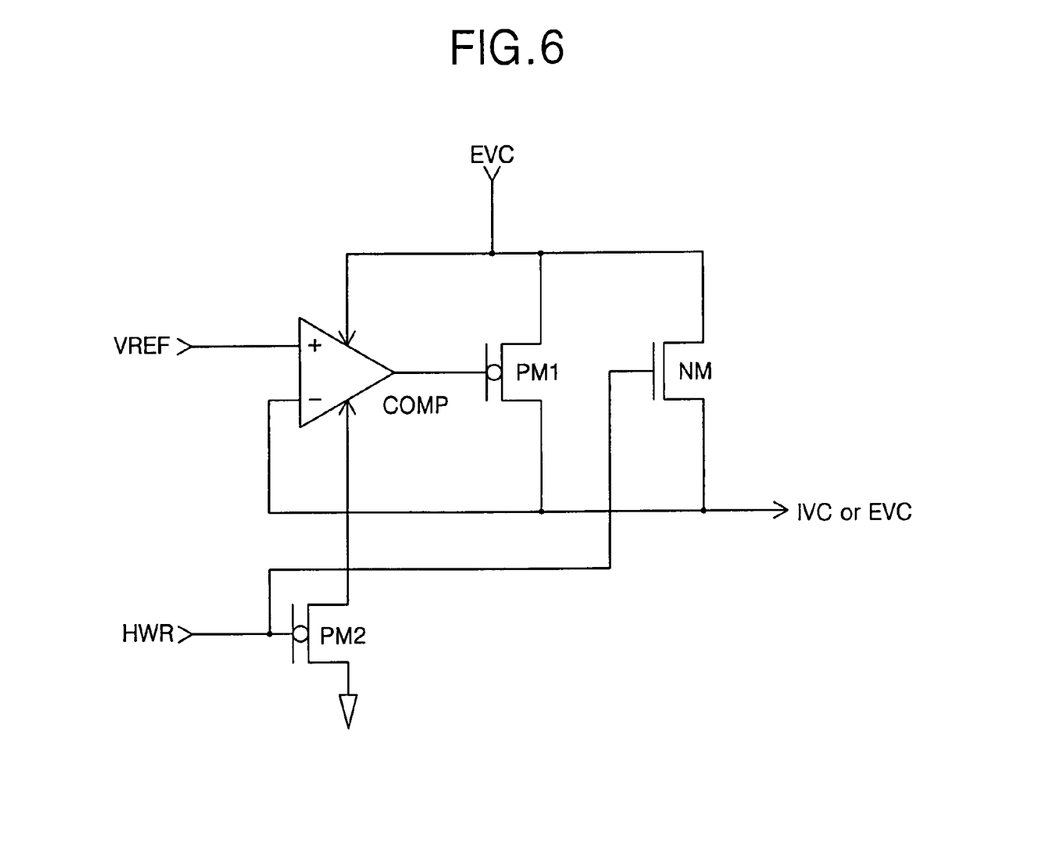
FIG. 6 is a circuit diagram illustrating a power supply circuit for supplying an electrical power to a data line according to the exemplary embodiment of the present invention.

FIG. 6 is a circuit diagram illustrating one example of a power supply circuit for supplying electrical power to the data line according to an embodiment of the present invention.

Referring to FIG. 6, the power supply circuit for supplying the electrical power to the data line comprises a comparator COMP detecting a voltage difference between the reference voltage VREF and the internal voltage IVC, a PMOS transistor PM1 which generates the internal voltage IVC according to the comparison result of the comparator COMP and feedbacks it to the comparator while applying it to the data input circuit 54, a PMOS transistors PM2 determining whether to enable the comparator COMP in accordance with the hidden write signal HWR, and an NMOS transistor NM applying the external voltage EVC to the data input circuit 54 in accordance with the hidden write signal HWR.

When the hidden write operation using the CBR refresh operation is requested such that the hidden write signal HWR is enabled, the comparator COMP is disabled and the PMOS transistor Pm1 does not generate the internal voltage IVC. On the other hand, the NMOS transistor NM is turned ON to apply the external voltage EVC to the data input circuit 54.

When the hidden write operation using the CBR refresh operation is not requested such that the hidden write signal HWR is disabled, the NMOS transistor is turned OFF and the external voltage EVC is not applied to the data input circuit 54, but the comparator COMP is enabled to perform the comparison operation. The PMOS transistor PM1 generates the internal voltage IVC from the external voltage EVC according to the comparison result of the comparator COMP and outputs it to the data input circuit 54.

As described above, the power supply circuit 62 of FIG. 6 generates the internal voltage IVC from the external voltage EVC and supplies it to the data input circuit 54, and it supplies the external voltage EVC instead of the internal voltage IVC when the hidden write operation using the CBR refresh command is requested.

Figure 7:
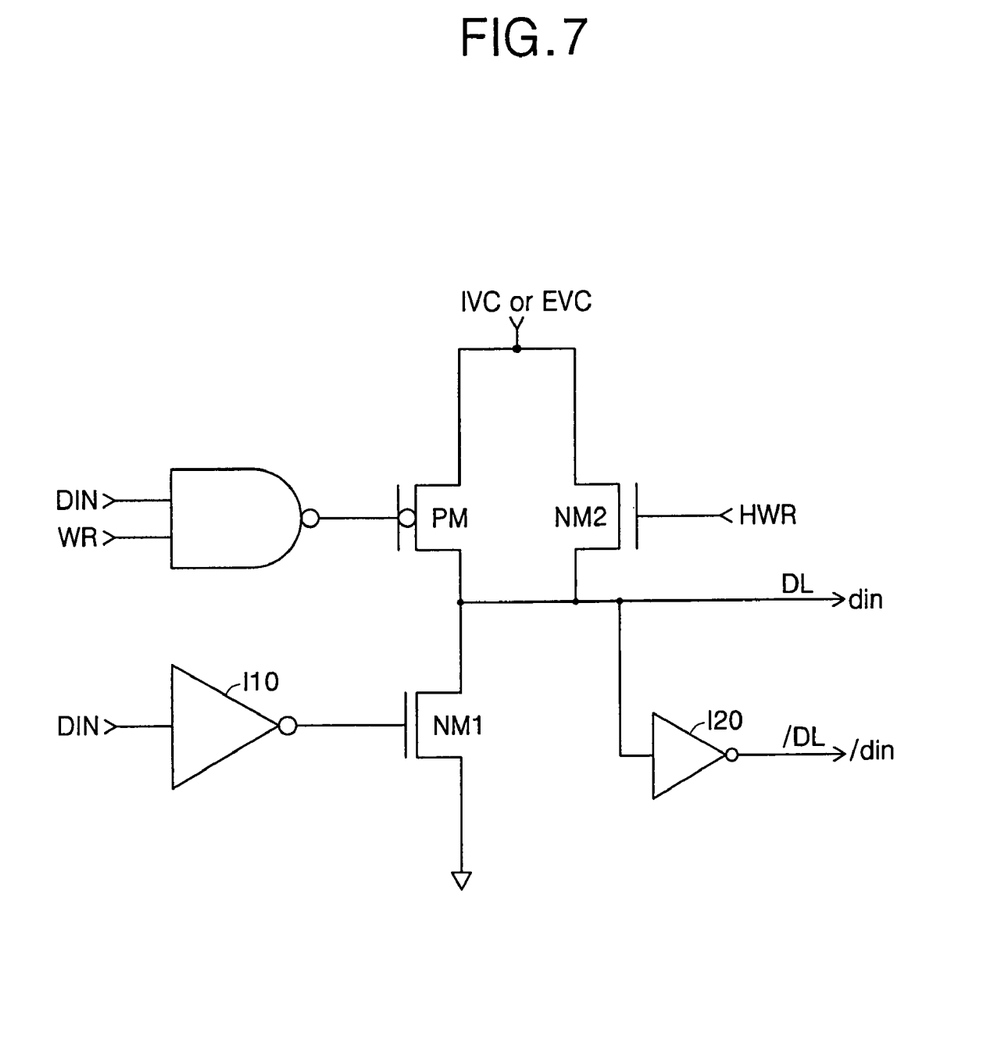
FIG. 7 is a circuit diagram illustrating a data input circuit according to the exemplary embodiment of the present invention.

FIG. 7 is a circuit diagram illustrating the data input circuit according to an embodiment of the present invention.

Referring to FIG. 7, the data input circuit 54 comprises an NAND gate logically combining data DIN and the write signal WR, an inverter I10 inverting the data DIN, a PMOS transistor PM applying the internal voltage IVC supplied according to the output signal of the NAND gate to the data line DL, an NMOS transistor NM1 applying a ground voltage VSS to the data line DL according to the output signal of the inverter I10, an inverter I20 inverting the signal of the data line DL and applying it to a complementary data line /DL, and an NMOS transistor NM2 applying the external voltage EVC to the data line DL according to the hidden write signal HWR.

Even through not shown in FIG. 6, the data line DL may be connected to one or more bit lines through a discrete control circuit. Data applied the data line DL are applied to a plurality of bit lines through the discrete control circuit.

When the hidden write operation using the CBR refresh command is requested, the data input circuit receives the external voltage EVC from the power supply circuit 62 and the enabled hidden write signal HWR from the hidden write control circuit 34. The NMOS transistor NM2 is turned ON to generate data din having a high level from the external voltage EVC and then to apply it to the data line DL, and the inverter I20 inverts the data din having a high level to generate the complementary data /din having a low level and applies it to the complementary data line /DL.

That is, the data input circuit 54 applies data din having a high level to the data line DL so that the memory cell can write a data value of "1".

On the other hand, when the CBR refresh operation for the test operation is terminated, the internal voltage IVC is applied and the hidden write signal HWR is disabled again, the NMOS transistor NM2 is turned OFF, so that the external voltage EVC is not applied to the data line DL. In this situation, when the write operation is requested such that the write signal WR is enabled and the data DIN having a high level is applied, the PMOS transistor PM is turned ON, and the NMOS transistor NM1 is turned OFF, so that the internal voltage IVC is applied to the data line DL. Also, when the data DIN having a low level is applied, the PMOS transistor PM is turned off, and the NMOS transistor NM1 is turned ON, so that the ground voltage VSS is applied to the data line DL. That is, the data input circuit 54 generates the data din having the same logical value as the external data DIN and applies it to the data line DL during the write operation.

As described above, the data input circuit 54 basically applies the external data DIN to the data line DL, and also applies the external voltage EVC to the data lines DL and /DL when the hidden write operation using the CBR refresh command is requested. Accordingly, electrical power may be adequately provided even when a plurality of memory cells simultaneously performs a write operation.

The foregoing semiconductor memory device according to an exemplary embodiment of the invention is designed such that the external voltage EVC is unconditionally applied to the data line when the hidden write operation associated with a test initialization is requested. However, other embodiments may be designed such that the internal voltage IVC is applied to the data line "as is" when it has a sufficient power supplying capacity such that the power failure does not occur even when all of the plurality of memory cells simultaneously perform the write operation. In other embodiments, a ground voltage, instead of an externally applied voltage EVC, may be applied to the data line.

As described above, a semiconductor memory device and operating method according to an embodiment of the invention integrates the dummy CBR refresh operation and the dummy write operation during a test initialization operation. As a result, test initializing time may be reduced over that required by a conventional semiconductor memory. Compared to the conventional semiconductor memory device in which only one memory can write data through the single dummy write operation, the semiconductor memory device according to an embodiment of the invention has the advantage of having all memory cells connected to a common word line write data through the single hidden write operation, thereby significantly reducing test time.

The foregoing embodiments are indicative of a broader range of design possibilities that fall within the scope of the invention as defined by the following claims.

What is claimed is:

1. A semiconductor memory device, comprising:
   a memory cell array including a plurality of memory cells selected in relation to a plurality of word lines and a plurality of bit lines;
   an address decoder selecting at least one word line in response to a refresh address and selecting all of the plurality of bit lines in response to a hidden write signal when a CBR refresh operation is requested during a test mode;
   a hidden write control circuit generating the hidden write signal when the CBR refresh operation is requested during the test mode;
   a refresh address generating circuit generating the refresh address when the CBR refresh operation is requested during the test mode; and
   a data input circuit applying data internally generated in response to the hidden write signal to all of the plurality of bit lines when the CBR refresh operation is requested during the test mode,
   wherein the hidden write signal is generated when a CBR signal requesting the CBR refresh operation is enabled while a test signal requesting a test mode setting for the test mode is enabled.

2. The device of claim 1, further comprising:
   a command decoder receiving and combining externally supplied commands to generate a mode setting signal requesting a mode setting operation, the CBR signal requesting the CBR refresh operation, or a write signal requesting a write operation; and
   a mode setting circuit receiving externally supplied addresses in accordance with the mode setting signal and analyzing the addresses to generate the test signal requesting the test mode setting for the test mode.

3. The device of claim 2, wherein the hidden write control circuit generates the hidden write signal when the test signal and the CBR signal are simultaneously enabled.

4. The device of claim 2, wherein the hidden write control circuit comprises;
   a first logical gate logically combining the test signal and the CBR signal to generate the hidden write signal; and
   a delay circuit delaying the hidden write signal by a predetermined time period.

5. The device of claim 1, wherein the address decoder comprises;
   a row decoder selecting at least one word line in response to the refresh address; and
   a column decoder simultaneously selecting the plurality of bit lines in response to the hidden write signal.

6. The device of claim 4, further comprising:
   a power supply circuit generating an internal voltage from an externally supplied voltage and outputting the externally supplied voltage in response to the hidden write signal.

7. The device of claim 6, wherein the power supply circuit comprises;
   a comparator comparing a reference voltage and the internal voltage;
   a first transistor generating and outputting the internal voltage from the externally supplied voltage in response to a comparison result from the comparator; and
   a second transistor disabling the comparator and outputting the externally supplied voltage in response to the hidden write signal.

8. The device of claim 6, wherein the data input circuit applies externally supplied data to at least one of the plurality of bit lines selected by the address decoder, and receives the externally supplied voltage via the power supply circuit to generate the internally generated data to all of the plurality of bit lines in response to the hidden write signal, wherein the internally generated data is data corresponding to the externally supplied voltage.

9. The device of claim 8, wherein the data input circuit comprises:
   a second logical gate logically combining the externally supplied data and the write signal provide by the command decoder;

an inverter inverting the externally supplied data;
a third transistor outputting the internal voltage supplied by the power supply circuit to a data line in response to a signal output from the second logical gate;
a fourth transistor for outputting a ground voltage to the data line in response to a signal output from the inverter; and
a fifth transistor outputting the external voltage supplied from the power supply circuit to the data line in accordance with the hidden write signal,
wherein the data line is connected to at least one bit line.

10. A semiconductor memory device, comprising:
a plurality of banks each including a plurality of memory cells selected in accordance with a plurality of word lines and a plurality of bit lines;
an address decoder selecting all of the plurality of banks, selecting at least one word line in response to a refresh address, and selecting all of the plurality of bit lines in response to a hidden write signal when a CBR refresh operation is requested during a test mode;
a hidden write control circuit generating the hidden write signal when the CBR refresh operation is requested during the test mode;
a refresh address generating circuit generating the refresh address when the CBR refresh operation is requested during the test mode; and
a data input circuit applying data internally generated in response to the hidden write signal to all of the plurality of bit lines when the CBR refresh operation is requested during the test mode,
wherein the hidden write signal is generated when a CBR signal requesting the CBR refresh operation is enabled while a test signal requesting a test mode setting for the test mode is enabled.

11. The device of claim 10, further comprising:
a command decoder receiving and combining externally supplied commands to generate a mode setting signal requesting a mode setting operation, the CBR signal requesting the CBR refresh operation, or a write signal requesting a write operation; and
a mode setting circuit receiving externally supplied addresses in accordance with the mode setting signal and analyzing the externally supplied addresses to generate the test signal for requesting the test mode setting for the test mode.

12. The device of claim 11, wherein the hidden write control circuit generates the hidden write signal when the test signal and the CBR signal are simultaneously enabled.

13. The device of claim 12, wherein the hidden write control circuit comprises;
a first logical gate logically combining the test signal and the CBR signal to generate the hidden write signal; and
a delay circuit delaying the hidden write signal by a predetermined time period.

14. The device of claim 11, wherein the address decoder comprises;
a bank selecting circuit generating the bank selecting signal simultaneously selecting all of the plurality of banks when the CBR signal is received during the test mode;
a row decoder circuit having a plurality of row decoders respectively corresponding to the plurality of banks, selecting a corresponding bank in response to the bank selecting signal, and selecting at least one word line in response to the refresh address in the test mode; and
a column decoder circuit having a plurality of column decoders respectively corresponding to the plurality of banks, and simultaneously selecting all of the plurality of bit lines in response to the hidden write signal in the test mode.

15. The device of claim 10, further comprising:
a power supply circuit generating an internal voltage from an externally supplied voltage and outputting the external voltage in response to the hidden write signal.

16. The device of claim 15, wherein the power supply circuit comprises;
a comparator comparing a reference voltage and the internal voltage;
a first transistor generating and outputting the internal voltage from the externally supplied voltage in response to a comparison result from the comparator; and
a second transistor disabling the comparator and outputting the external voltage in response to the hidden write signal.

17. The device of claim 15, wherein the data input circuit applies externally supplied data to bit lines selected by the address decoder, and receives the externally supplied voltage to generate the internally generated data to all of the plurality of bit lines in response to the hidden write signal, wherein the internally generated data is data corresponding to the externally supplied voltage.

18. The device of claim 17, wherein the data input circuit comprises
a second logical gate logically combining the externally supplied data and the write signal provided by the command decoder;
an inverter inverting the externally supplied data;
a third transistor outputting the internal voltage supplied from the power supply circuit to a data line in response to a signal output from the second logical gate;
a fourth transistor outputting a ground voltage to the data line in response to a signal output from the inverter; and
a fifth transistor outputting the externally supplied voltage from the power supply circuit to the data line in response to the hidden write signal,
wherein the data line is connected to at least one bit line.

19. An operating method for a semiconductor memory device including a plurality of banks, each including a plurality of memory cells selected in accordance with a plurality of word lines and a plurality of bit lines, the method comprising:
after generating a CBR signal, generating a hidden write signal when a CBR refresh operation is requested during a test mode;
generating a refresh address in response to the CBR signal;
selecting all of the plurality of bit lines of the plurality of banks in response to the hidden write signal such that data internally generated in response to the hidden write signal is written to all memory cells connected to at least one word line of each of the plurality of banks.

20. The method of claim 19, further comprising:
setting the test mode in response to an externally applied command;
generating the CBR signal in response to a request for the CBR refresh operation while in the test mode; and
generating the hidden write signal after the CBR signal is generated.

21. The method of claim 19, further comprising:
applying an externally supplied voltage to the plurality of bit lines when the hidden write signal is generated.

* * * * *